United States Patent [19]

Keeney et al.

[11] Patent Number: 5,801,991
[45] Date of Patent: Sep. 1, 1998

[54] DESELECTED WORD LINE THAT FLOATS DURING MLC PROGRAMMING OF A FLASH MEMORY

[75] Inventors: Stephen N. Keeney, San Jose; Albert Fazio, Los Gatos; Ken Wojciechowski, Rancho Cordova; Mark Bauer, Cameron Park, all of Calif.

[73] Assignee: Intel Corporation, Santa Clara, Calif.

[21] Appl. No.: 829,245

[22] Filed: Mar. 31, 1997

[51] Int. Cl.$^6$ .................................................. G11C 7/00
[52] U.S. Cl. ........................ 365/185.23; 365/185.11; 365/185.18
[58] Field of Search ..................... 365/185.23, 185.11, 365/185.18, 230.03, 230.06

[56] References Cited

U.S. PATENT DOCUMENTS

| | | | |
|---|---|---|---|
| 5,440,505 | 8/1995 | Fazio et al. | 365/45 |
| 5,473,564 | 12/1995 | Kowalsky | 365/185.23 |
| 5,497,354 | 3/1996 | Sweha et al. | 365/230.06 |
| 5,532,971 | 7/1996 | Tanaka et al. | 365/185.23 |
| 5,539,690 | 7/1996 | Talreja et al. | 365/185.22 |
| 5,574,686 | 11/1996 | Watsuji et al. | 365/185.23 |

FOREIGN PATENT DOCUMENTS

PCT/US95/ 06230 5/1995 WIPO .................. G11C 13/00

*Primary Examiner*—Son T. Dinh
*Attorney, Agent, or Firm*—Blakely, Sokoloff, Taylor & Zafman

[57] ABSTRACT

A method of programming a flash memory cell. The method occurs in a memory device having a decoder that receives a select signal. The decoder is coupled to a first word line and a second word line. The first word line is coupled to a first memory cell and the second word line is coupled to a second memory cell. The select signal is asserted to a first voltage such that the decoder selects the first word line and the first memory cell and deselects the second word line and the second memory cell. The select signal is then asserted to a second voltage such that the decoder couples a programming voltage to the first word line and floats the second word line. The first memory cell is then programmed while the second word line is floating.

23 Claims, 7 Drawing Sheets

FIG. 7

DESELECTED WORD LINE THAT FLOATS DURING MLC PROGRAMMING OF A FLASH MEMORY

FIELD OF THE INVENTION

The present invention relates to the programming of memory cells. More particularly, the present invention relates to a method and circuitry for programming flash memory cells in a memory device.

BACKGROUND

Nonvolatile memory devices such as Electrically programmable Read Only Memories ("EPROMs"), Electrically Erasable PROGRAMMABLE READ ONLY MEMORIES ("EEPROMS"), and flash EEPROMs include an array of nonvolatile memory cells and supporting circuitry for accessing the array. A nonvolatile memory cell typically behaves like a field effect transistor and includes a select or control gate that controls the reading and writing of data to the memory cell and a floating gate that traps charge corresponding to data stored by the memory cell.

An attractive feature of nonvolatile semiconductor memories is their ability to store analog data. This permits storage of multiple bits of data in a single memory cell. As charge is added to the floating gate of a memory cell, the threshold voltage Vt of the memory cell increases, and the memory cell drain current ID ("cell current") decreases. The memory cell threshold voltage Vt is related to the memory cell drain current ID such that ID is proportional to:

$$Gm \times (VG-Vt) \text{ for } VD>VG-Vt$$

where Gm is the transconductance of the memory cell; VG is the memory cell gate voltage; VD is the memory cell drain voltage; and Vt is the memory cell threshold voltage.

For memory cells storing multiple bits of data, each of the possible patterns of bits represents one state. In effect, the cell is storing base S data, where S is the number of states the cell is capable of storing. The bit pattern results from decoding the state data of one or multiple cells. For example, for memory cells storing two bits of data there are four bit patterns: 00, 01, 10, and 11. Each of these bit patterns is represented by a state. The particular state represented by a particular pattern of bits depends upon the type of coding used (e.g., Gray coding or binary). The type of coding generally does not effect the method of programming.

States may be defined in a variety of ways. They may be defined in terms of a range of threshold voltages Vt, a range of drain currents ID, or a range of charge.

Figure 1:
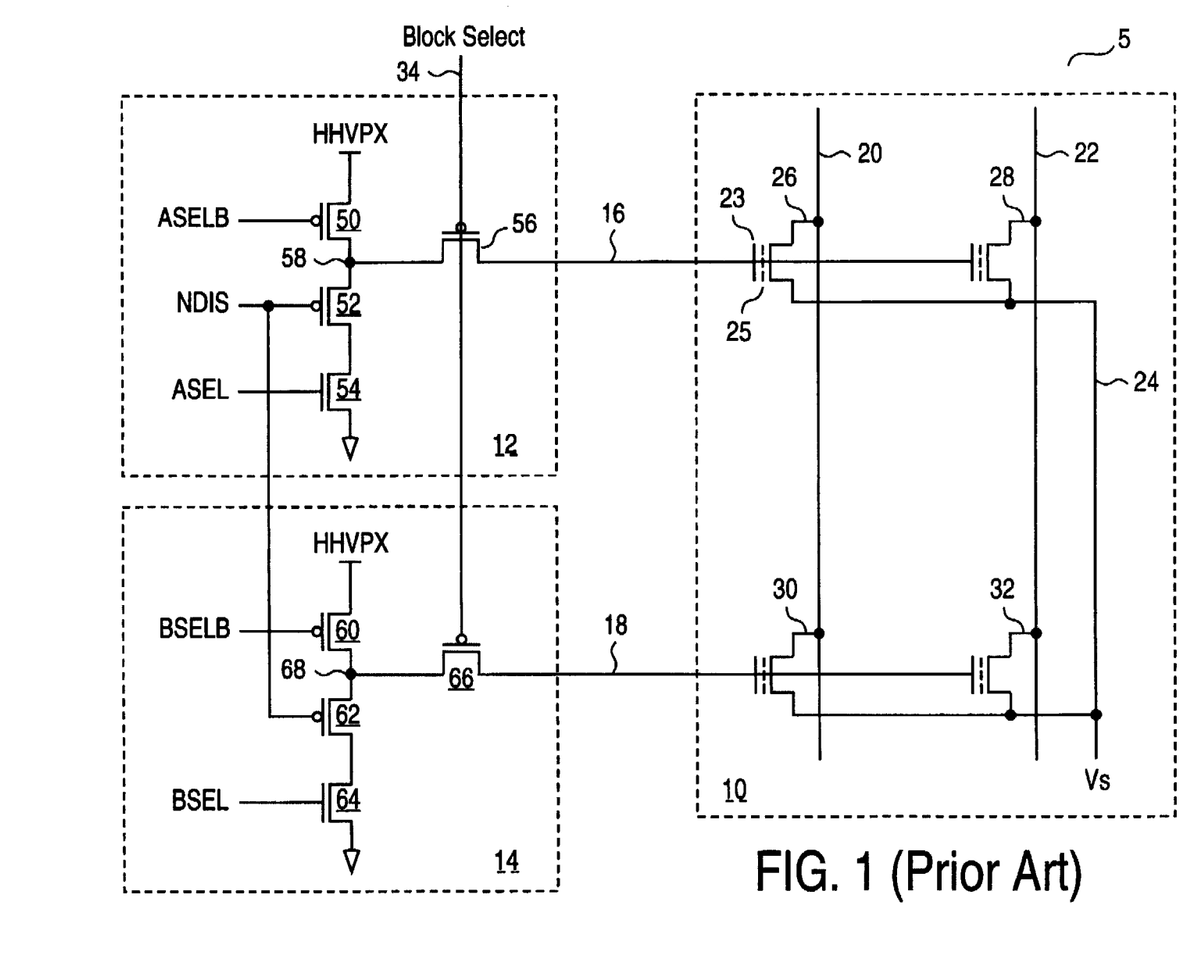
FIG. 1 is a prior art memory device including a flash memory array and X decoders.

FIG. 1 illustrates a conventional memory device 5 having a flash memory array 10 coupled to X decoders 12 and 14. Flash memory array 10 includes four flash memory cells 26, 28, 30, and 32 formed at the intersections of word lines 16 and 18 and bit lines 20 and 22. Each flash memory cell includes a select gate and a floating gate. For example, flash memory cell 26 includes select gate 23 and floating gate 25. Flash memory cells 26 and 28 have their select gates coupled to word line 16, and flash memory cells 30 and 32 have their select gates coupled to word line 18. Flash memory cells 26 and 30 have one terminal or electrode coupled to bit line 20 and another terminal or electrode coupled to a common source line 24 that is coupled to source voltage VS. Similarly, flash memory cells 28 and 32 have one terminal or electrode coupled to bit line 22 and another terminal or electrode coupled to a common source line 24.

Word lines 16 and 18 are also referred to as X lines or row lines because each word line is coupled to an X decoder circuit. For example, word line 16 is coupled to X decoder 12 and word line 18 is coupled to X decoder 14. X decoders 12 and 14 provide the necessary voltages on word lines 16 and 18 to read, erase, or program data into flash memory cells 26, 28, 30, and 32.

X decoder 12 includes three MOSFETs 50, 52, and 54 coupled in series between a voltage source HHVPX and ground. Transistor 50 has its gate coupled to select signal ASELB such that when ASELB is low, then transistor 50 passes HHVPX to node 58. The gate of transistor 54 is coupled to another select signal ASEL such that when ASEL is high, then transistor 54 passes ground to transistor 52. Transistor 52 has its gate coupled to NDIS such that when NDIS is low and ASEL is high, then a low voltage is present at node 58. X decoder 12 also includes p-channel MOSFET 56 having one terminal coupled to node 58, another terminal coupled to word line 16, and its gate coupled to block select signal 34.

X decoder 14 has a similar structure to X decoder 12, including a series of three transistors 60, 62, and 64 coupled between HHVPX and ground. Transistor 60 has its gate coupled to select signal BSELB such that when BSELB is low, then transistor 60 passes HHVPX to node 68. The gate of transistor 64 is coupled to BSEL such that when BSEL is high, then transistor 64 passes ground to transistor 62. Transistor 62 has its gate coupled to NDIS such that when NDIS is low and BSEL is high, then a low voltage is present at node 68. X decoder 14 also includes p-channel MOSFET 66 having one terminal coupled to node 68, another terminal coupled to word line 18, and its gate coupled to block select signal 34.

P-channel transistors 56 and 66 operate as local decoders for word lines 16 and 18, respectively. When the absolute value of the voltage difference between the voltage on block select signal 34 and the voltage at node 58 is greater than or equal to the absolute value of the threshold voltage of p-channel transistor 56, then the voltage at node 58 is coupled to word line 16. Similarly, when the absolute value of the voltage difference between the voltage on block select signal 34 and voltage at node 58 is less than the absolute value of the threshold voltage of p-channel transistor 66, then the voltage at node 68 is coupled to word line 18.

Together the bit lines, word lines, X decoders, and the common source line provide a means of applying to the memory cells the voltages necessary for programming, erasing, and reading memory cells within array 10. Memory cells 26, 28, 30, and 32 may be erased using Fowler-Nordheim tunneling by X decoders 12 and 14 applying approximately zero volts on word lines 16 and 18, allowing bit lines 20 and 22 to float, and setting VS to approximately 12 volts on common source line 24. In this configuration, the entire array of memory cells may be erased at once. Alternatively, the entire array of memory cells maybe erased using negative gate erasure, that is, setting VS to approximately 5–6 volts and applying approximately −8 to −10 volts on word lines 16 and 18. Memory cells 26, 28, 30, and 32 may be read by X decoders 12 and 14 applying approximately one to seven volts on word lines 16 and 18, applying approximately one volt to bit lines 20 and 22, and setting VS to approximately zero volts on common source line 24.

Memory cells 26, 28, 30, and 32 may be programmed via hot electron injection by applying a voltage on bit line 20 or 22 that is approximately 5–7 volts above VS, and X decoder 12 or 14 applying a voltage level to word line 16 or 18, respectively, that is sufficient to change the amount of charge stored and the threshold voltage of the memory cells being programmed. Typically one or more flash memory cells in a row of cells are programmed at one time while the other rows of memory cells are deselected. For example, to select flash memory cells 26 and 28 for programming to a selected state, ASELB and ASEL are asserted low to bring node 58 to approximately HHVPX. Similarly, BSELB and BSEL are asserted high to bring node 68 to approximately ground.

In order to set word line 18 at ground such that flash memory cells 30 and 32 are not programmed or draw current, block select signal 34 must have a voltage level that is at least one threshold voltage lower than the voltage at node 68. For example, if the threshold voltage of p-channel transistor 66 is −3 volts, then block select signal 34 must be set at least −3 volts in order to pass zero volts at node 68 to word line 18. With block select signal 34 at −3 volts, p-channel transistor 56 is also enabled and the voltage at node 58 may be passed to word line 16. Selected memory cell 26, for example, may then be programmed by applying a programming pulse on bit line 20 for a predetermined duration of time while holding bit line 22 at or near ground. A programming methodology such as that disclosed in U.S. Pat. No. 5,440,505 entitled METHOD AND CIRCUITRY FOR STORING DISCRETE AMOUNTS OF CHARGE IN A SINGLE MEMORY ELEMENT may be used to program the selected cell.

As previously stated, programming a selected memory cell alters its threshold voltage. Ranges of threshold voltages correspond to states programmed into the flash memory cell. Generally, the higher the voltage applied to word line 16 during the programming of memory cell 26, then the greater the amount of charge stored on floating gate 25 resulting in an increased threshold voltage for memory cell 26. Increasing the threshold voltages of selected memory cell 26 is generally desirable, as it enables more states to be programmed into a cell or provides for a wider range of threshold voltages per state. Therefore, it is desirable to be able to provide high programming voltages or gate voltages to word lines 16 and 18 to increase the maximum possible charge stored by memory cells 26, 28, 30, or 32.

As illustrated in the example above, to deselect memory cells 30 and 32 during the programming of memory cell 26, zero volts must be passed from node 68 to word line 18 by p-channel transistor 66. The zero volts may be passed by p-channel transistor 66 to word line 18 if block select signal 34 is approximately −3 volts for one example, where −3 volts is the threshold voltage of p-channel transistor 66. However, the −3 volts is also applied to p-channel transistor 56 and thus limits the maximum voltage that can be applied from node 58 to word line 16 because of process constraints and the physical device characteristics of p-channel transistor 56. For example, there is typically a maximum voltage differential that may be applied across p-channel transistor 56 and node 58 before undesirable events occur that cause p-channel transistor 56 and memory device 5 to fail. Undesirable events typically include oxide breakdown, accelerated wear-out of the oxide, or defects in the oxide causing problems with the operation of p-channel transistor 56. For these reasons, the maximum voltage that may be coupled to word line 16 from node 58 by p-channel transistor 56 is limited by the voltage on block select signal 34. For example, if the maximum voltage that may be applied across the gate of p-channel transistor 56 and node 58 is 12.5 volts and block select signal 34 is −3 volts, then the maximum voltage that may be applied to node 58 is limited to only 9.5 volts. For this example, p-channel transistor 56 may then couple only 9.5 volts to word line 16. It is desirable to have the voltage applied to word line 16 during programming of memory cell 26 to be as high as 12.5 volts. More generally, it is desirable to have the voltage applied to word line 16 during programming of memory cell 26 to be as high as possible for a given fabrication process.

SUMMARY OF THE INVENTION

A method of programming a flash memory cell is described. The method occurs in a memory device having a decoder that receives a select signal. The decoder is coupled to a first word line and a second word line. The first word line is coupled to a first memory cell and the second word line is coupled to a second memory cell. The select signal is asserted to a first voltage such that the decoder selects the first word line and the first memory cell and deselects the second word line and the second memory cell. The select signal is then asserted to a second voltage such that the decoder couples a programming voltage to the first word line and floats the second word line. The first memory cell is then programmed while the second word line is floating.

Other features and advantages of the present invention will be apparent from the accompanying drawings and from the detailed description that follows.

BRIEF DESCRIPTION OF THE DRAWINGS

The features and advantages of the present invention are illustrated by way of example and not limitation in the figures of the accompanying drawings in which like references indicate similar elements and in which.

DETAILED DESCRIPTION

A method and apparatus for programming a memory cell while floating deselected word lines is disclosed. The embodiments described below are for increasing the number of states that may be stored in a memory cell, for increasing the charge that may be stored in selected memory cells, or for increasing the range of threshold voltages that represent a programmed state of a memory cell.

As will be described in more detail below, one embodiment of the present invention includes a method of programming a flash memory cell such that increased gate or programming voltages may be applied to a selected word line and a selected memory cell than was previously possible for particular memory device architectures and given fabrication processes. For this embodiment, a block select signal is applied to an X decoder to enable approximately zero volts to be applied to a first group of word lines such that memory cells coupled to these word lines are deselected. Subsequently, the voltage of the block select signal is increased such that an increased program or gate voltage may be applied to one or more selected word lines coupled to one or more selected memory cells. The increased voltage of the block select signal causes the deselected word lines coupled to the deselected memory cells to float during the programming of the selected memory cells. Programming of the selected memory cells is completed prior to the voltage on the deselected word lines rising to a level that may cause the memory device to draw unacceptable levels of current, or to fail.

Figure 2:
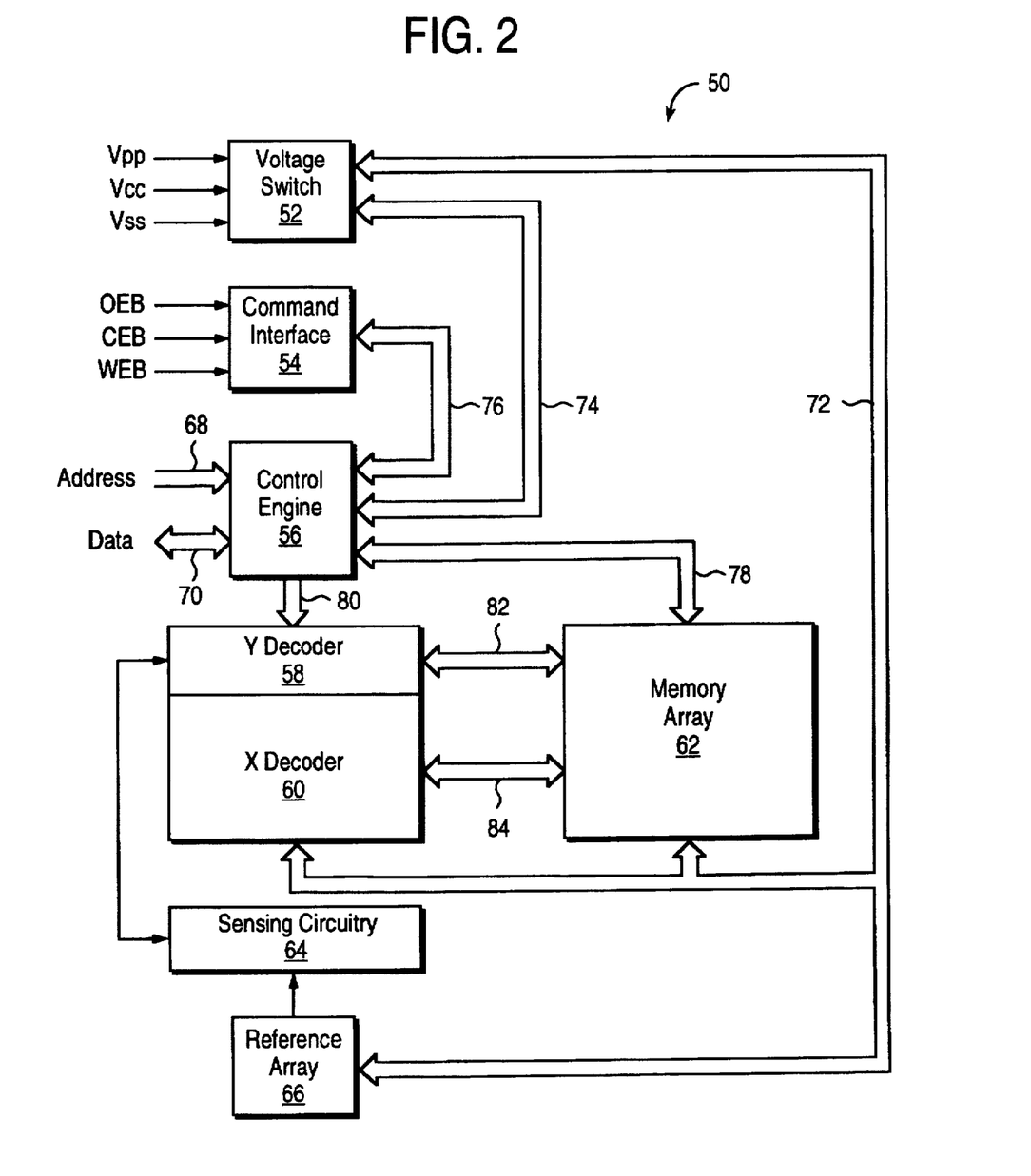
FIG. 2 is a block diagram of a memory device in which embodiments of the present invention may be incorporated.

FIG. 2 illustrates in block diagram form nonvolatile memory device 50 in which embodiments of the present invention may be practiced. Variations to nonvolatile memory device 50 as known by those skilled in the art are also included within the scope of this application. Furthermore, the embodiments described below may also be practiced in volatile memory arrays including DRAM arrays including memory cells that may store multiple states of information.

Memory device 50 includes voltage switch 52, command interface 54, control engine 56, Y decoder 58, X decoder 60, memory array 62, sensing circuitry 64, and reference array 66. Memory device 50 stores data using nonvolatile memory cells within memory array 62. The threshold voltages of the nonvolatile memory cells can be altered during programming, thus permitting storage of analog voltage levels. Memory array 62 may include any type of memory cell with programmable threshold voltages, such as memory cells with trapping dielectrics or floating gates. For one embodiment, memory array 62 includes flash memory cells. Memory device 50 may be fabricated on a single semiconductor substrate.

One or more memory cells in memory array 62 are selected via bus 84 by X decoder 60 and via bus 82 by Y decoder 58 in response to an address on address bus 68. Data read from memory array 62 is coupled to Y decoder 58 via bus 82 and passed to sensing circuitry 64. Sensing circuit 64 determines the state of data presented to it using reference cell array 66. Other means may be used to determine the state of the data read from memory array 62. One example of circuitry that may be used to determine the state of data read from memory array 62 is disclosed in published PCT application PCT/US95/06230 having international publication number WO 95/23074 published on Dec. 14, 1995, and entitled SENSING SCHEMES FOR FLASH MEMORY WITH MULTILEVEL CELLS. Another example of circuitry that may be used to determine the state of data read from memory array 62 is disclosed in U.S. Pat. No. 5,539,690 entitled WRITE VERIFY SCHEMES FOR FLASH MEMORY WITH MULTILEVEL CELLS. Yet another example of circuitry that may be used to determine the state of data read from memory array 62 is disclosed in U.S. Pat. No. 5,497,354 entitled BIT MAP ADDRESSING SCHEMES FOR FLASH MEMORY.

For one embodiment of memory device 50, control engine 56 controls erasing and programming of memory array 62. Control engine 56 also controls the programming of multilevel cells, as described in more detail below. For one embodiment, control engine 56 includes a processor controlled by microcode. For another embodiment, control engine 56 is a state machine or logic circuits that implements the various functions for erasing and programming memory cells in memory array 62.

Control engine 56 manages memory array 62 via control of X decoder 60, Y decoder 58, sensing circuitry 64, reference cell array 66, and voltage switch circuitry 52. Voltage switch 52 controls the various voltage levels necessary to read, program, and erase memory array 62. Voltage switch 52 receives power supply voltage VCC, VSS or ground, and a program/erase voltage VPP. VPP may be externally applied to memory device 50, or it may be generated within memory device 50 and supplied to voltage switch 52. VPP may provide HHVPX described with respect to FIG. 3 below. Read, program and erase voltages are supplied to X decoder 60, Y decoder 58, memory array 62 and reference array 66 via bus 72. Control engine 56 communicates with voltage switch 52 via bus 74, with command interface 54 via bus 76, with memory array 62 via bus 78, and with Y decoder 58 and X decoder 60 via bus 80.

User commands for reading, erasing, and programming are communicated to control engine 56 via command interface 54. An external user issues commands to command interface 54 via control signals including output enable OEB, chip select CEB, and write enable WEB. Other control signals may be used.

Memory device 50 may be coupled to a microprocessor or any other type of controller device or logic (programmable or otherwise) that may generate control, address, and/or data signals for memory device 50. Memory device 50 may be used in any kind of computer or data processing system. A computer system within which memory device 50 may be used may be a personal computer, a notebook computer, a laptop computer, a personal assistant/communicator, a minicomputer, a workstation, a mainframe, a multiprocessor computer, or any other type of computer system. In addition, a system in which memory device 50 is used may be a printer system, a cellular phone system, a digital answering system, a digital camera, or any other data storage system.

Figure 3:
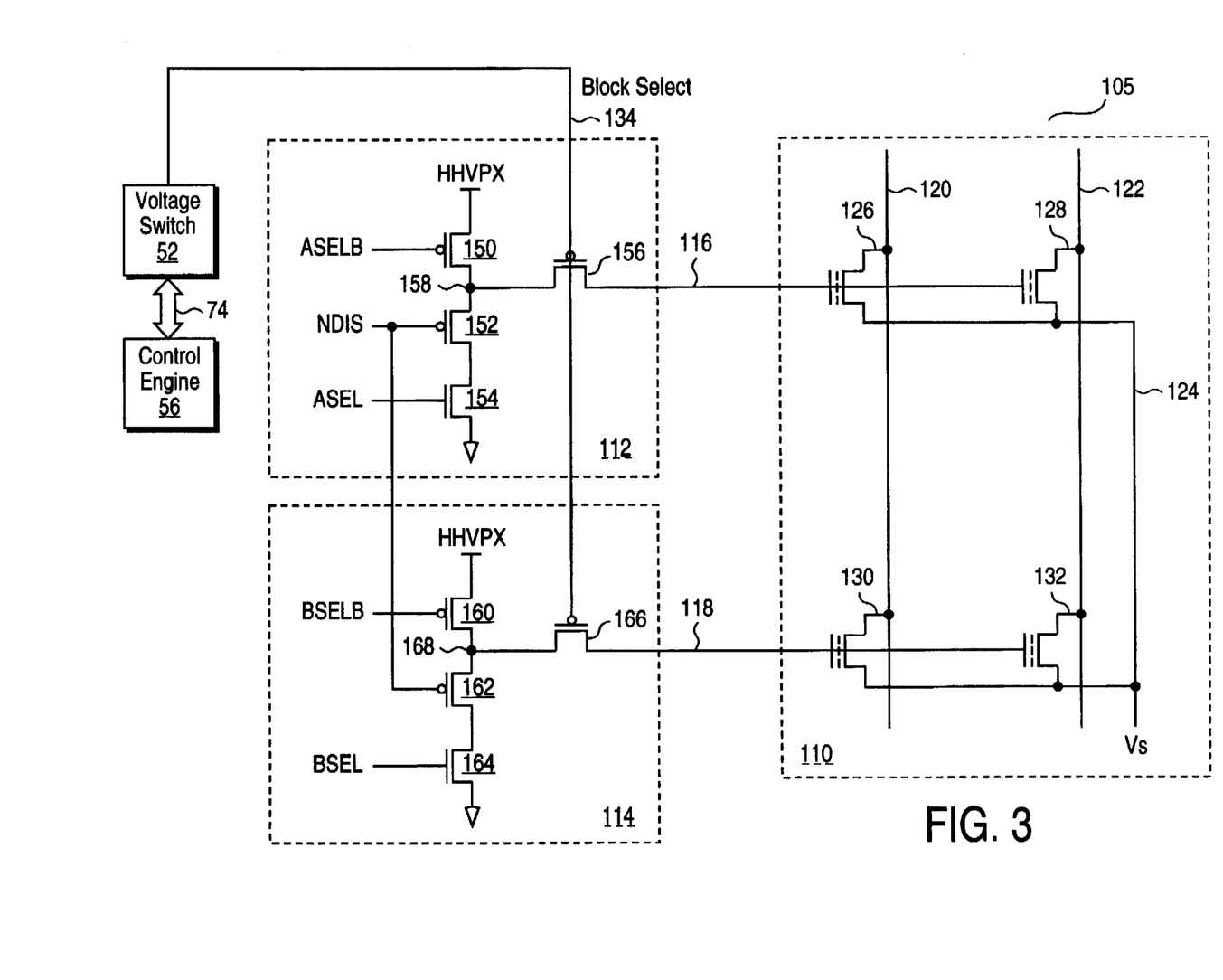
FIG. 3 is a memory device including a flash memory array and X decoders.

The programming of one or more bits of data into memory cells in memory array 62 is described with reference to FIG. 3–5. FIG. 3 shows memory device 105 having flash memory array 110 coupled to voltage switch 52 and control engine 56. Control engine 56 controls the programming, erasing, and reading of memory array 110. Control engine 56 may also provide ASELB, ASEL, BSELB, BSEL and/or NDIS to X decoders 112 and 114. Voltage switch 52 provides the voltages necessary for the bit lines, word lines, and common source line of memory array 110. Voltage switch 52 may also provide HHVPX to X decoders 112 and 114.

Flash memory array 110 includes a 2×2 matrix of flash memory cells 126, 128, 130, and 132. Flash memory array 110 is a portion of memory array 62 that may include much larger arrays. Memory array 62 may also include multiple blocks of memory and flash memory array 110 may be a part of one of the multiple blocks of memory. Memory device 105 also includes X decoders 112 and 114 coupled to word lines 116 and 118, respectively, and each receiving block select signal 134. X decoders 112 and 114 may be multiple X decoders or may be one X decoder coupled to word lines 116 and 118. Block select signal 134 enables local decoder p-channel transistors 156 and 166 to pass voltages from nodes 158 and 168, respectively, to word lines 116 and 118, respectively. Memory device 105 includes elements having like reference numbers as memory device 5 of FIG. 1 (e.g., transistors 150, 152, and 154 of FIG. 3 correspond to transistors 50, 52, and 54 of FIG. 1). However, the method of programming a state representing a plurality of bits or a range of threshold voltages in one or more of flash memory cells 126, 128, 130, and 132 differs significantly over the method previously described with respect to FIG. 1.

Figure 4:
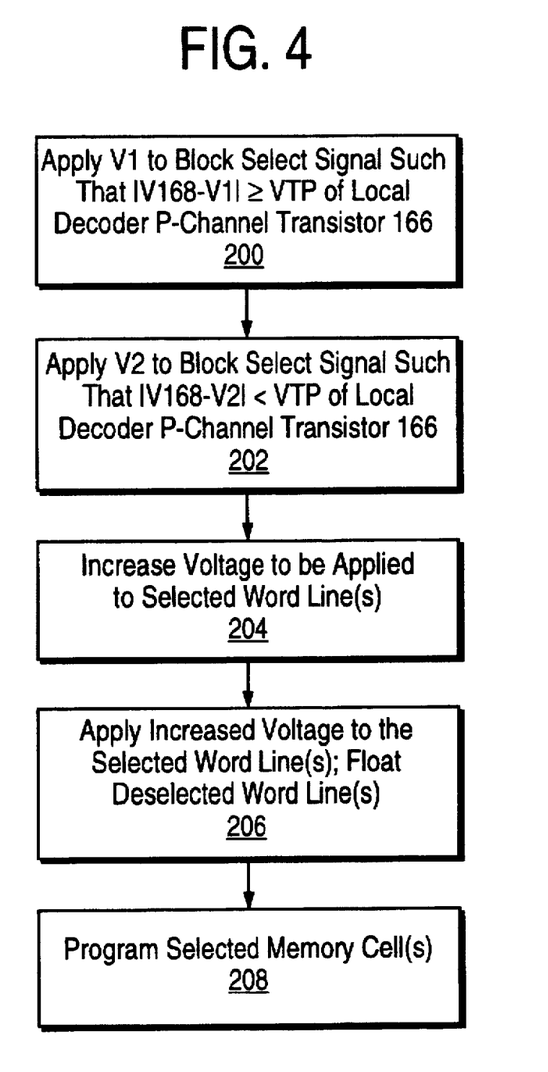
FIG. 4 is a flow diagram of a method of programming one or more memory cells.
Figure 5:
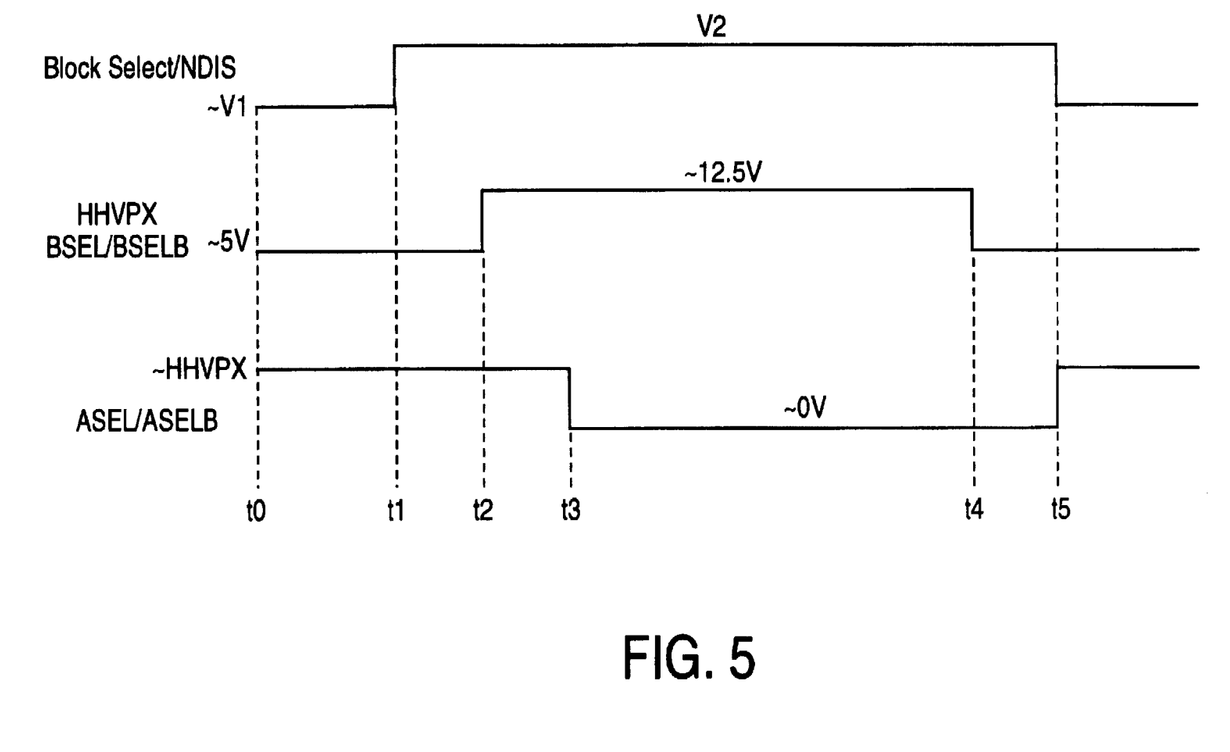
FIG. 5 is a timing diagram of the method of programming one or more memory cells according to FIG. 4.

FIGS. 4 and 5 illustrate one embodiment for programming memory cell 126 of memory array 110. More than one memory cell in a selected row may be programmed at the same time, or that more than one row of memory cells may be programmed at the same time. The embodiment illustrated in FIGS. 4 and 5 may be used to program memory cell 126 to store more charge corresponding to a higher threshold voltage than was previously possible for a given fabrication process and the architecture of the memory device of FIG. 1.

At step 200 and time t0, block select signal 134 is asserted to voltage V1 such that the absolute value of the voltage difference between node 168 (V168) and V1 is greater than or equal to the absolute value of the threshold voltage VTP of p-channel transistor 166. If at time t0, BSELB and BSEL are coupled to a high logic state (e.g., HHVPX approximately equal to 4–6 volts), then node 168 will be pulled to ground by transistors 162 and 164 when NDIS is low (e.g., coupled to block select signal 134) causing p-channel transistor 166 to pull word line 118 to ground. When word line 118 is pulled to ground, word line 118 is deselected and memory cells 130 and 132 are deselected and will not be programmed. For example, if the threshold voltage of p-channel transistor 166 is −3 volts and node 168 is approximately ground or zero volts, then p-channel transistor 166 will pass zero volts to word line 118 if block select signal 134 has a voltage less than or equal to −3 volts.

FIG. 5 illustrates that NDIS and block select signal 134 may be coupled together or may be separately controlled. Similarly, BSEL and BSELB may be coupled together or separately controlled, and ASEL and ASELB may be coupled together or separately controlled.

Also, at time t0, ASELB and ASEL may be held at a high logic state (e.g., HHVPX approximately equal to 4–6 volts) such that word line 116 is deselected and memory cells 126 and 128 are deselected. For an alternative embodiment, ASELB and ASEL may be held at a low logic state at time t0 enabling HHVPX to be coupled to node 158 and to be coupled to word line 116 via p-channel transistor 156. For the alternative embodiment, selected memory cell 126 may be programmed by supplying a programming pulse to bit line 120 and the appropriate voltage on VS coupled to common source line 124.

At step 202 and time t1, block select signal 134 is asserted to voltage V2 such that the absolute value of the voltage difference between node 168 and V2 is less than the absolute value of the threshold voltage VTP of p-channel transistor 166. If at time t1, BSELB and BSEL are coupled to a high logic state (e.g., HHVPX), then node 168 will be pulled to ground and p-channel transistor 166 will be cutoff causing word line 118 to float. Over time, floating deselected word line 118 will rise towards the absolute value of the threshold voltage VTP of p-channel transistor 166. With the block select signal at an elevated voltage relative to time t0, the program or gate voltage that may be applied to selected word line 116 and selected memory cell 126 may be increased at step 204 and time t2. For one embodiment, V2 is approximately equal to zero volts.

At step 206 and time t3, ASEL and ASELB transition to low states and the increased program or gate voltage may then be coupled to selected word line 116 from node 158 via p-channel transistor 156. The gate voltage (HHVPX) may be increased to the maximum voltage that may applied across the gate oxide of p-channel transistor 156 and node 158. For example, if the given fabrication process allows approximately 12.5 volts to be applied across the gate of p-channel transistor 156 and node 158, then increasing the voltage on block select signal 134 to approximately zero volts enables the voltage at node 158 (i.e., HHVPX) to be increased to approximately 12.5 volts. If the threshold voltage of p-channel transistors 156 and 166 is approximately −3 volts, then the maximum programming or gate voltage that can be applied to word line 116 and selected memory cell 126 may be increased from approximately 9.5 volts when block select signal 134 is approximately −3 volts, to approximately 12.5 volts with block select signal 134 is approximately zero volts. Of course these numbers are used for illustration purposes only, and the numbers may be adjusted depending upon the process technology and other device parameters as will be understood by one of ordinary skill in the art.

At step 208 and during the time span between t3 and t4, memory cell 126 (and/or memory cell 128) may be programmed to a selected state representing a plurality of bits or a range of thresholds by applying a programming pulse on bit line 120 for a predetermined period of time and the appropriate voltage on VS. For one embodiment, the voltage on bit lines 120 and 122 is increased to approximately 5–7 volts, and VS is set to approximately zero volts such that VDS of each selected memory cell is approximately 5–7 volts while HHVPX is applied to word line 116. During this time, in contrast to the method of programming the circuitry of FIG. 1, word line 118 remains floating. Care must be taken to program memory cell 126 before word line 118 increases to unacceptable voltage levels (e.g., approximately 500 millivolts) that would cause an undesirable amount of current (e.g., approximately 10 microamps) to be drawn by memory cell 130 when bit line 120 is selected, or that may otherwise cause memory device 105 to fail. Typical rise times for floating deselected word line 118 may be approximately 1 millivolt/millisecond, and a typical programming window between times t3 and t4 may be approximately 200 microseconds.

At time t4, the programming or gate voltage may be returned to a non-program voltage level (e.g., approximately 4–6 volts). At time t5, block select signal 134 and/or NDIS may be returned to a voltage level such that deselected word line 118 does not float. Similarly, at time t5, ASEL and ASELB may be asserted high such that node 158 is pulled to ground.

For another embodiment, during the time between t3 and t4, a number of different voltages may be applied to word line 116 for the same or varying duration.

Control engine 56 generally controls the operation of memory device 105 and the generation of ASEL, ASELB, BSEL, BSELB, NDIS, HHVPX, and block select signal 134. Block select signal 134 may be generated by voltage switch 52 of FIG. 2 under the control of command interface 54 and/or control engine 56. The block select signal may be coupled to X decoder 60 via bus 60. Alternatively, a separate block select circuit may be incorporated within memory device 50 and be coupled to control engine 56 and voltage switch 52 so as to provide the appropriate voltages on block select signal 134 at the appropriate times.

Figure 6:
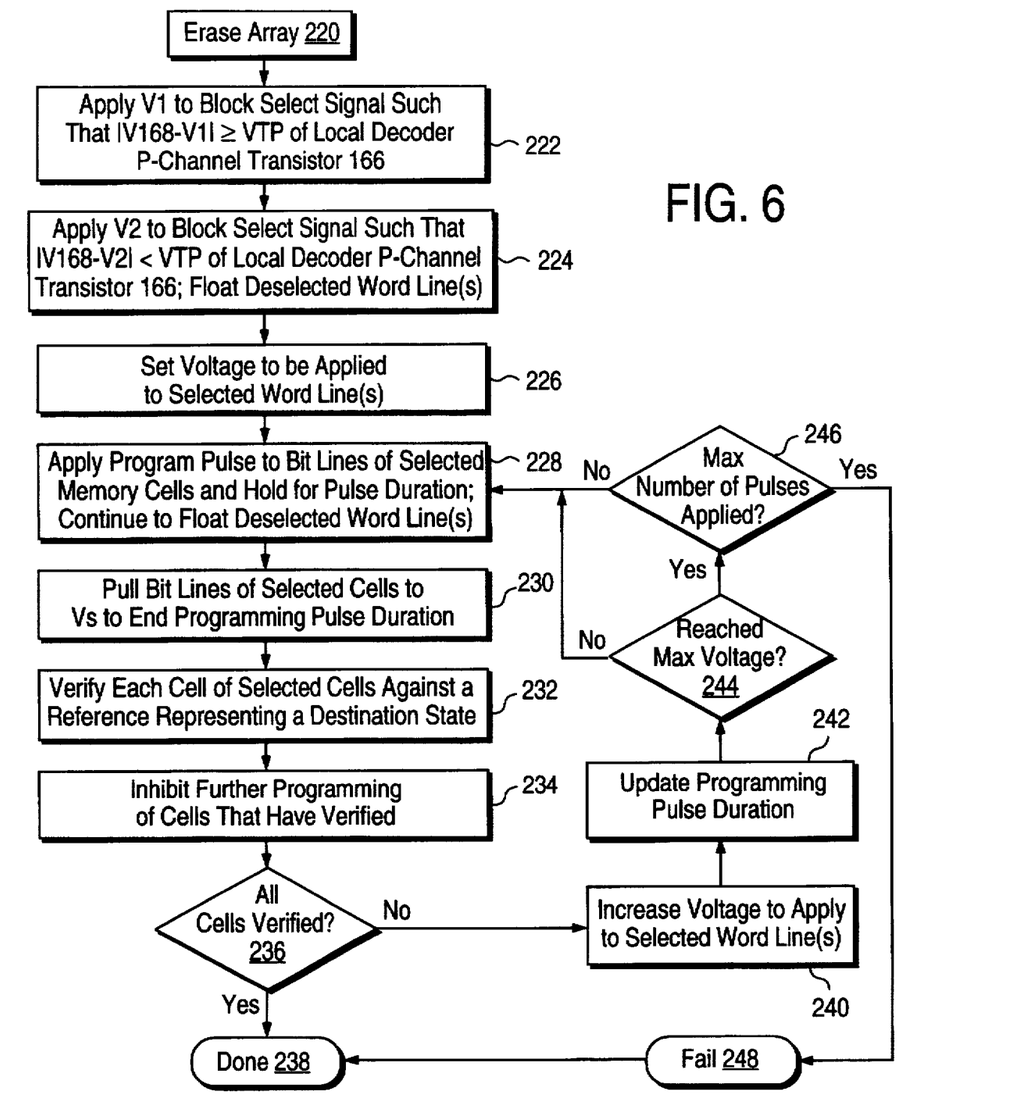
FIG. 6 is another flow diagram of a method of programming one or more memory cells.

FIG. 6 illustrates another method of programming one or more selected memory cells according to the present invention. The embodiment illustrated in FIG. 6 is an improvement upon the exact placement algorithm disclosed in U.S. Pat. No. 5,440,505.

Briefly described, the method of FIG. 6 programs all memory cells in a selected group (e.g., memory cells 126 and 128 coupled to word line 116) simultaneously, regardless of their destination states; i.e., regardless of the amount of charge to be placed in each memory cell. An initial voltage is applied to one or more word lines coupled to the selected memory cells and a programming pulse is applied to bit lines coupled to all memory cells in the selected group. Afterward, each memory cell within the selected group is program verified to determine whether it has been programmed to its destination state. Program verification refers to the process of determining whether a defined amount of charge has been placed in a memory cell. Examples of verification circuitry are disclosed in published PCT application PCT/US95/06230, U.S. Pat. No. 5,539,690, and U.S. Pat. No. 5,497,354. No additional programming pulses are applied to those memory cells that program verify. If any memory cell within the selected group does not program verify, the word line voltage is increased and another programming pulse is applied to those memory cells that did not verify. Subsequent programming pulses may be of a shorter duration than previous programming pulses. Preferably, programming occurs in the saturation region of the curve of the threshold voltage of a flash memory cell versus time as illustrated in U.S. Pat. No. 5,440,505. The process of programming, verifying, and increasing the gate voltage continues until all memory cells verify or a maximum gate voltage is reached. Additionally, the method of FIG. 6 incorporates the method of FIG. 4 to increase the programming or gate voltage applied to a selected word line or group of word lines such that greater amounts of charge may be stored in a selected memory cell(s), and greater threshold voltages may be achieved for programmed memory cells.

Control engine 56 begins by erasing memory array 62 at step 220 to place an initial state in each memory cell. At step 222, control engine 56 causes voltage switch circuit 52 to pull block select signal 134 to voltage V1 such that the absolute value of the voltage difference between node 168 (V168) and V1 is greater than or equal to the absolute value of the threshold voltage VTP of p-channel transistor 166. Step 222 is the same as step 200 of FIG. 4. If at time t0, BSELB and BSEL are coupled to a high logic state (e.g., HHVPX approximately equal to 4–6 volts), then node 168 will be pulled to ground by transistors 162 and 164 when NDIS is low causing p-channel transistor 166 to pull word line 118 to ground. When word line 118 is pulled to ground, word line 118 is deselected and memory cells 130 and 132 are deselected.

At step 224 and time t1, block select signal 134 is asserted to voltage V2 such that the absolute value of the voltage difference between node 168 (V168) and V2 is less than the absolute value of the threshold voltage VTP of p-channel transistor 166. For one embodiment, V2 is approximately zero volts. Step 224 is the same as step 202 of FIG. 4. If at time t1, BSELB and BSEL are coupled to a high logic state (e.g., HHVPX equal to approximately 4–6 volts), then node 168 will be pulled to ground and p-channel transistor 166 will be cutoff causing word line 118 to float. With the block select signal at an elevated voltage relative to time t0, the program or gate voltage that may be applied to selected word line 116 and selected memory cell 126 may be increased at step 226 and time t2. For example, at time t2, the HHVPX may be increased to approximately 6.0 volts.

At time t3, ASEL and ASELB transition to low states and the voltage at node 158 (i.e., HHVPX) may be coupled to selected word line 116 while deselected word line 118 is floating. Under the control of control engine 56, during step 226 and between times t3 and t4, a program or gate voltage is applied to word line 116 to program memory cell 126 and/or memory cell 128. Additionally, a pulse is applied to bit line 120 and/or bit line 122 for a sufficient duration to cause memory cells 126 and/or 128 to be programmed. For one embodiment, the voltage on bit lines 120 and 122 is increased to approximately 5–7 volts, and VS is set to approximately zero volts such that VDS of each selected memory cell is approximately 5–7 volts while HHVPX is applied to word line 116. Memory cells that are not to be programmed would have their bit line coupled to approximately zero volts.

At step 230 and time t4, control engine 56 stops the programming of the selected memory cell(s) by bringing the bit line voltages of the selected memory cell(s) to VS such that VDS equals approximately zero volts. Typical times between t2 and t4 includes from 1–5 microseconds.

At step 232 and between times t4 and t5, control engine 56 determines the success of the programming operation at step 230 via program verification. During verification, the state of each memory cell is read and compared to a reference representative of a destination state. Verification may be performed as described with respect to FIG. 4. If a memory cell has reached its destination state, it is said to have verified. Conversely, if a memory cell has not yet been programmed to its destination state, then the memory cell is said to not have verified, or to have failed verification. For the embodiment illustrated in FIGS. 6 and 7, deselected word line 118 remains floating during both the programming time of t2 to t4, and the verification time of t4 to t5.

With verification complete, control engine 56 branches to step 234 and inhibits further programming of memory cells that have verified. This may be accomplished by setting the bit lines of the cells that have verified to VS. Other inhibit mechanisms may be used.

Figure 7:
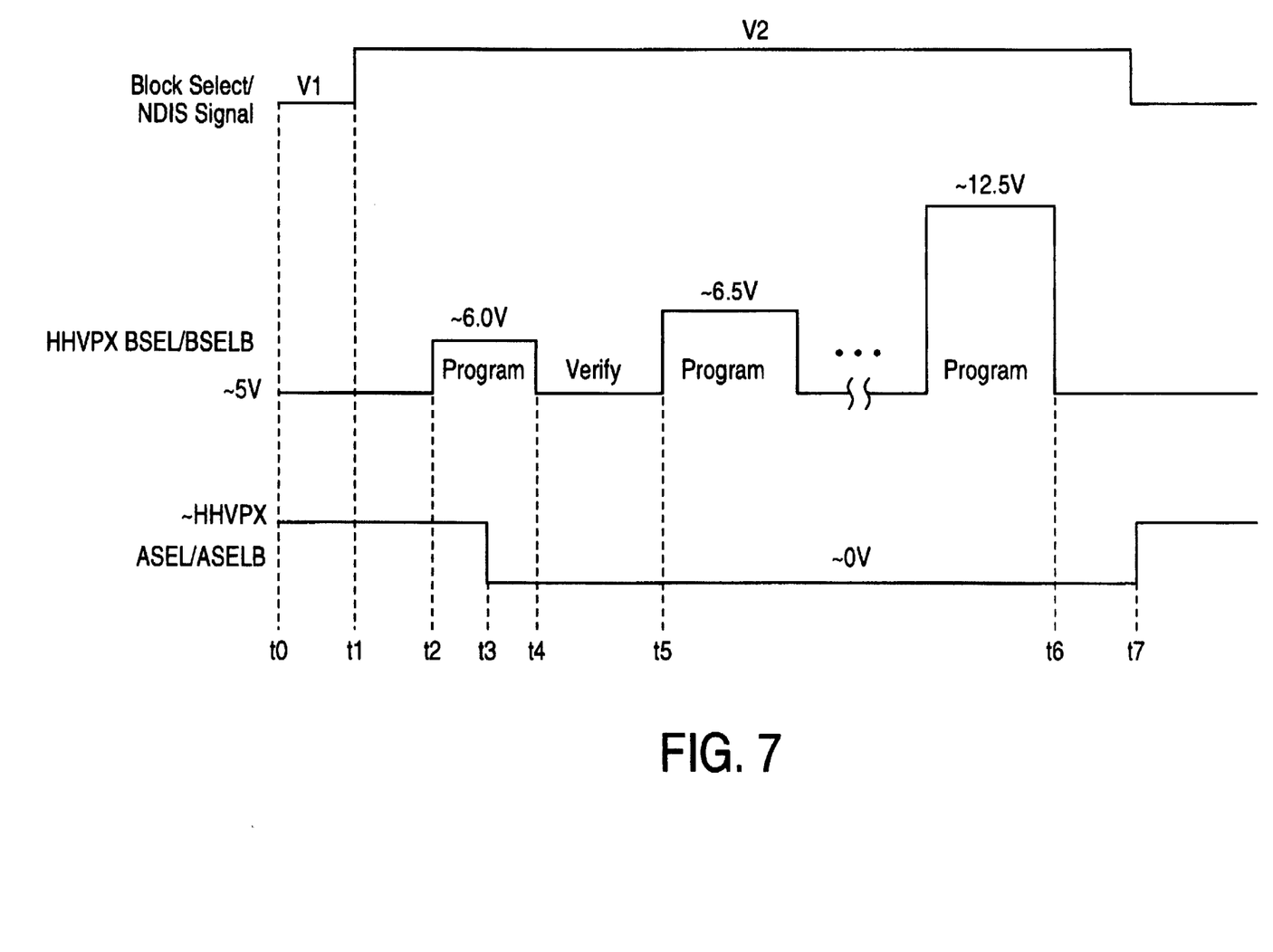
FIG. 7 is a timing diagram of the method of programming one or memory cells according to FIG. 6.

At step 236, control engine 56 determines if any further programming pulses are required for the selected memory cell(s). If any of the selected memory cells have not yet been verified, then at step 240, the program or gate voltage applied to selected word line 116 (i.e., HHVPX) is increased. For example, as illustrated in FIG. 7, the program or gate voltage may be increased from approximately 6.0 volts to 6.5 volts. Although a step size of 0.5 volts is illustrated in FIG. 7, any step size may be used. At step 242, the pulse duration of the pulse applied to bit line 120 and/or bit line 122 is updated. If the program or gate voltage applied to word line 116 has not reached a maximum voltage dictated by the fabrication process at step 244, then another program pulse is applied to the selected cells that have not yet verified. If the maximum program or gate voltage to be applied to word line 116 has been reached, then control engine 56 determines if a predetermined maximum number of pulses have been applied at step 246. The maximum number of pulses is a design choice. For one embodiment, the maximum number of pulses may range from 5 to 50 pulses. If the maximum number of pulses has been applied to the selected memory cells, then the control engine 56 determines that the process has failed at step 248 and the process stops at step 238.

If the maximum number of pulses has not been reached at step 246 or if the maximum program or gate voltage has not been reached at step 244, then the process transitions back to step 228 and another pulse is applied to the selected memory cells that have not yet verified. Program and verify steps are altered until all the cells have been verified.

During the programming and verification steps, deselected word line 118 continues to float until ASEL and ASELB are brought high or until block select signal 134 is brought to V1 at time t7. For one embodiment, the threshold voltage of p-channel transistors 156 and 166 is approximately −3 volts and block select signal 134 is set to approximately zero volts at time t2, thus enabling the maximum program voltage to reach approximately 12.5 volts for a given fabrication process. As previously described, the maximum voltage is limited only by the fabrication process and device characteristics of p-channel transistors 156 and 166.

When the pulse duration is updated for subsequent pulses at step 242, the pulse duration may remain the same, be increased, or be decreased relative to the previous pulse duration. For one embodiment, the pulse duration is decreased relative to the previous pulse duration to reduce the change in the threshold voltage and drain current caused by increased total programming time which could lead to overshooting states as described in U.S. Pat. No. 5,440,505.

As previously described, deselected word line 118 typically may increase at a rate of approximately 1 millivolt/millisecond while deselected word line 118 is floating. So long as the programming time between times t2 and t7 is completed before deselected word line 118 floats to a voltage that causes memory cells 130 and/or 132 to draw undesirable amounts of current, then floating deselected word line 118 while programming memory cells 126 and/or 128 is advantageous. For one embodiment, deselected word line 118 may float for approximately 200 microseconds during times t1 to t7.

Floating a deselected word line during the programming of memory cells coupled to a selected word line may be incorporated into other programming algorithms besides the exact placement algorithm illustrated in FIGS. 6 and 7. For example, the method of programming multiple nonvolatile memory cells independently using the exact placement algorithm also disclosed in U.S. Pat. No. 5,440,505 may be used.

The method of FIGS. 6 and 7 may be further modified such that voltage V2 applied to block select signal 134 is not increased as in step 224 until the program or gate voltage HHVPX has been increased to a level such that the voltage differential between block select signal 134 and node 158 approaches the maximum voltage that can be applied across p-channel transistor 156.

For this alternative embodiment, the program and verification steps may be repeated until the program or gate voltage reaches a predetermined voltage. During this first period of time, word line 118 is deselected but not floating. The predetermined voltage may be a voltage that is one step below the maximum voltage that p-channel transistors 156 and/or 166 can withstand without causing p-channel transistors 156 or 166 to fail as previously described. Alternatively, the predetermined voltage may be the maximum voltage that p-channel transistors 156 and/or 166 can withstand. For example, if the threshold voltage of p-channel transistors 156 and 166 is approximately −3 volts, the maximum voltage that transistors 156 and 166 can withstand is approximately 12.5 volts, block select signal 134 is set at approximately −3 volts at time t0, the step size of the program or gate voltage is 0.5 volts, then the predetermined voltage may be approximately 9.0 volts. Other voltages may be selected as the predetermined voltage.

After the predetermined voltage is reached, then block select signal 134 may be increased as described in step 224 of FIG. 6. Thus, during a second period of time, deselected word line 118 will be floating while word line 116 receives increased voltages to be applied to selected memory cells 126 and/or 128. This alternative embodiment of FIG. 6 may also be incorporated into the embodiment of FIG. 4. This method reduces the total time that the deselected word lines are floating.

For other embodiments, during the verify steps illustrated in FIG. 7, the voltage of block select signal 134 may be adjusted to ground or to other voltages.

The embodiments described above help to increase the program or gate voltage applied to selected memory cells such that the selected memory cells may be programmed to store more states, store more bits or information, store more charge, be programmed with increased threshold voltages, or be programmed with increased ranges of threshold voltages for each state programmed. This may be accomplished without changing technologies or fabrication processes to withstand higher oxide stresses. This may also be accomplished without introducing more complexity into the fabrication process or into the logic and circuitry that provides programming voltages to selected memory cells. Avoiding increasing the logic and circuitry complexity enables X decoders 112 and 114 to use less die area than alternative approaches that may incorporate additional logic or circuitry.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. In a memory device having a decoder receiving a select signal and coupled to a first word line and a second word line, a first memory cell coupled to the first word line, and a second memory cell coupled to the second word line, a method of programming the first memory cell comprising the steps of:

asserting the select signal to a first voltage such that the decoder selects the first word line and the first memory cell and deselects the second word line and the second memory cell;

asserting the select signal to a second voltage such that the decoder couples a programming voltage to the first word line and floats the second word line; and programming the first memory cell while the second word line is floating.

2. The method of claim 1, wherein asserting the select signal to the first voltage comprises asserting the select signal to a negative voltage.

3. The method of claim 1, wherein the decoder includes a transistor having a threshold voltage, a first electrode coupled to the select signal, a second electrode configured to receive a third voltage, and a third electrode coupled to the second word line, wherein:

the absolute value of a difference between the first voltage and the third voltage is greater than or equal to the absolute value of the threshold voltage of the transistor; and the absolute value of a difference between the first voltage and the third voltage is less than the absolute value of the threshold voltage of the transistor.

4. The method of claim 1, wherein the transistor is a p-channel MOSFET.

5. The method of claim 1, wherein the first memory cell is a nonvolatile memory cell.

6. The method of claim 1, wherein the first memory cell has a select gate coupled to the first word line, a first electrode coupled to a bit line, and a second electrode coupled to a conductor, and wherein the programming step comprises:

applying a pulse having a predetermined voltage level and a predetermined duration to the bit line while the programming voltage is applied to the first word line by the decoder.

7. The method of claim 6, wherein the programming step further comprises:

verifying that the first memory cell has been programmed to a selected state;

increasing the predetermined voltage and repeating the applying and verifying steps if the memory cell has not been programmed to the selected state.

8. The method of claim 7, wherein the increasing step further comprises decreasing the predetermined duration of pulse if the memory cell has not been programmed to the desired state.

9. The method of claim 1, wherein the first voltage is less than the second voltage.

10. The method of claim 1, wherein the programming step comprises programming the first memory cell to a selected state representing a plurality of data bits.

11. The method of claim 1, wherein the programming step comprises programming the first memory cell to a selected state representing a range of threshold voltage for the first memory cell.

12. In a memory device having a first memory cell having a select gate coupled to a first word line, a first electrode coupled to a bit line, and a second electrode coupled to a conductor, and a second memory cell having a select gate coupled to a second word line, a first electrode coupled to the bit line, and a second electrode coupled to the conductor, a method of programming the first memory cell comprising the steps of:

applying a first voltage to the first word line and a second voltage to the second word line such that the first memory cell is selected and the second memory cell is deselected; and floating the second word line and applying a program voltage to the first word line programming the first memory cell while the second word line is floating.

13. The method of claim 12, wherein the program voltage is greater than the first voltage.

14. The method of claim 12, wherein the programming step comprises programming the first memory cell to a selected state representing a plurality of data bits.

15. The method of claim 12, wherein the programming step comprises programming the first memory cell to a selected state representing a range of threshold voltages for the first memory cell.

16. The method of claim 12, wherein the floating step further comprises floating both the first and second word line prior to applying the program voltage to the first word line.

17. The method of claim 12 wherein the first memory cell is a nonvolatile memory cell.

18. In a memory device having a first memory cell coupled to a first word line and a second memory cell coupled to a second word line, a method of programming the first memory cell comprising the steps of:

applying a first voltage to the first word line and a second voltage to the second word line such that the first memory cell is selected and the second memory cell is deselected;

programming the first memory cell to a first state while the second memory cell is deselected;

floating the second word line; and programming the first memory cell to a second state while the second word line is floating.

19. The method of claim 18, wherein the first state represents a first plurality of data bits and the second state represents a second plurality of data bits.

20. The method of claim 18 wherein the first state represents a first range of threshold voltages for the first memory cell, and the second state represents a second range of threshold voltages for the first memory cell.

21. A memory device comprising:

a first memory cell having a select gate coupled to a first word line;

a second memory cell having a select gate coupled to a second word line; and a decoder configured to receive a select signal and having a first output coupled to the first word line and a second output coupled to the second word line, wherein when the select signal comprises a first voltage then the decoder selects the first word line and the first memory cell and deselects the second word line and the second memory cell, and wherein when the select signal comprises a second voltage then the decoder couples a programming voltage to the first memory cell and floats the second word line.

22. The memory device of claim 21, wherein the first memory cell is a nonvolatile memory cell.

23. The memory device of claim 21, wherein the decoder comprises a transistor having a first electrode coupled to the select signal, a second electrode configured to receive a third voltage, and a third electrode coupled to the second word line, wherein the absolute value of a difference between the first voltage and the third voltage is greater than or equal to the absolute value of the threshold voltage of the transistor, and wherein the absolute value of a difference between the second voltage and the third voltage is less than the absolute value of the threshold voltage of the transistor.

* * * * *